United States Patent
Baillin et al.

(10) Patent No.: US 8,999,762 B2
(45) Date of Patent: Apr. 7, 2015

(54) PROCESS FOR ENCAPSULATING A MICRO-DEVICE BY ATTACHING A CAP AND DEPOSITING GETTER THROUGH THE CAP

(71) Applicant: Commissariat à l'énergie atomique et aux énergies alternatives, Paris (FR)

(72) Inventors: Xavier Baillin, Crolles (FR); Jean-Louis Pornin, Crolles (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 209 days.

(21) Appl. No.: 13/645,717

(22) Filed: Oct. 5, 2012

(65) Prior Publication Data

US 2013/0089955 A1    Apr. 11, 2013

(30) Foreign Application Priority Data

Oct. 11, 2011  (FR) ...................... 11 59167

(51) Int. Cl.
*H01L 21/16*  (2006.01)
*B81C 1/00*  (2006.01)
(Continued)

(52) U.S. Cl.
CPC ............ *B81C 1/00285* (2013.01); *H01L 23/26* (2013.01); *H01L 21/50* (2013.01); *B81C 2201/019* (2013.01); *B81C 2203/0118* (2013.01); *B81C 2203/0145* (2013.01); *H01L 2924/0002* (2013.01)

(58) Field of Classification Search
CPC ................. H01L 21/56; H01L 23/26

USPC .......... 438/124, 125, 126, 127; 257/E21.502, 257/E21.503
See application file for complete search history.

(56) References Cited

U.S. PATENT DOCUMENTS

| 7,968,986 B2 | 6/2011 | Hovey et al. | |
| 2002/0179921 A1* | 12/2002 | Cohn | 257/99 |
| 2004/0036183 A1* | 2/2004 | Im et al. | 257/796 |

(Continued)

FOREIGN PATENT DOCUMENTS

| EP | 2 197 780 B1 | 6/2010 |
| FR | 2 841 380 A1 | 12/2003 |

(Continued)

OTHER PUBLICATIONS

U.S. Appl. No. 13/644,444, filed Oct. 4, 2012, Pornin et al.

(Continued)

*Primary Examiner* — Julia Slutsker
(74) *Attorney, Agent, or Firm* — Oblon, McClelland, Maier & Neustadt, L.L.P.

(57) ABSTRACT

A process for encapsulating a micro-device in a cavity formed between a first and a second substrate is provided, including producing the micro-device in or on the first substrate; attaching and securing the second substrate to the first substrate, thereby forming the cavity in which the micro-device is placed; producing at least one hole through one of the two substrates, leading into the cavity opposite a portion of the other of the two substrates; depositing at least one getter material portion through the hole on said portion of the other of the two substrates; and hermetically sealing the cavity by closing the hole.

16 Claims, 6 Drawing Sheets

(51) Int. Cl.
*H01L 23/26* (2006.01)
*H01L 21/50* (2006.01)

(56) References Cited

U.S. PATENT DOCUMENTS

| | | |
|---|---|---|
| 2004/0219706 A1 | 11/2004 | Wan |
| 2005/0017313 A1 | 1/2005 | Wan |
| 2005/0184382 A1* | 8/2005 | Chen et al. ............... 257/698 |
| 2005/0202591 A1 | 9/2005 | Chen et al. |
| 2007/0242341 A1 | 10/2007 | Natarajan et al. |
| 2007/0242345 A1 | 10/2007 | Natarajan et al. |
| 2007/0262428 A1 | 11/2007 | Summers |
| 2008/0049386 A1* | 2/2008 | Pornin et al. ............ 361/679 |
| 2008/0308920 A1 | 12/2008 | Wan |
| 2010/0178419 A1 | 7/2010 | Baillin |
| 2010/0193215 A1* | 8/2010 | Baillin ..................... 174/50.5 |
| 2011/0079889 A1 | 4/2011 | Baillin |
| 2012/0112293 A1 | 5/2012 | Pornin et al. |

FOREIGN PATENT DOCUMENTS

| | | |
|---|---|---|
| FR | 2 903 678 A1 | 1/2008 |
| FR | 2 942 561 A1 | 8/2010 |

OTHER PUBLICATIONS

French Preliminary Search Report issued May 25, 2012 in French Patent Application No. 1159167 filed Oct. 11, 2011 (with English Translation of Categories of Cited Documents).

Office Action issued Jan. 16, 2014 in European Patent Application No. 12 187 740.1.

U.S. Appl. No. 13/530,513, filed Jun. 22, 2012, Caplet, et al.

* cited by examiner

US 8,999,762 B2

PROCESS FOR ENCAPSULATING A MICRO-DEVICE BY ATTACHING A CAP AND DEPOSITING GETTER THROUGH THE CAP

CROSS-REFERENCE TO RELATED APPLICATION

This application is based upon and claims the benefit of priority under 35 U.S.C. §119 from prior French Patent Application No. 11 59167, filed on Oct. 11, 2011. The entire content of the above application is incorporated herein by reference.

TECHNICAL FIELD

The invention relates to a process for encapsulating a micro-device, microsystem or micro-component, for example of the MEMS, NEMS or MOEMS type or an infrared microsensor such as a microbolometer, in a hermetic cavity formed between two substrates and in which a getter material is deposited.

PRIOR ART

Some micro-devices such as those of the MEMS or NEMS type or infrared microsensors must, for successful operation, be hermetically sealed or encapsulated in a cavity of which the atmosphere is controlled (control in particular of the nature of the gas and pressure in the cavity).

The technology used to obtain such an encapsulation consists first of producing these micro-devices collectively on a first silicon substrate (or wafer). Each of the micro-devices is then encapsulated in a cavity formed by attaching and hermetically sealing a cap, for example, formed by a second silicon substrate, on the first substrate. This hermetic assembly between the first and second substrate, collectively forming the encapsulation cavities for micro-devices, makes it possible in particular to prevent gas leakages between the inside of the cavities and the external environment.

The addition of non-evaporable getters (NEG) in the cavities, for example in the form of getter material portions placed in these cavities, makes it possible to control the characteristics of the atmosphere in the cavities. The getter material portions can be produced from a deposition of a thin film of the getter material on one or the other of the two substrates, prior to the operation of assembling the two substrates. A shaping of the getter material portions in the plane of the two substrates is then performed by technological operations of photolithography and etching of the thin film of getter material.

Alternatively, it is possible to deposit the getter material discretely, directly in the desired shape. For this, the getter material can be deposited directly on one or the other of the two substrates by lift-off, through a photosensitive resin film previously shaped by photolithography, with this film being removed after deposition of the getter material through it.

In these two cases, the production of the getter material portions requires the use of a resin deposited on the getter material which, by chemical interaction with the getter material, can degrade the pumping capacities of the getter material.

To limit this risk of chemical interaction, the getter material can be deposited through a stencil.

The use of resins, which may degrade the pumping capacities of the getter material, is thus avoided. However, the use of such a stencil is expensive because, on the one hand, it is necessary to produce a stencil specific to the encapsulation structure (to deposit the getter material in the desired locations), and, on the other hand, temporary stencil-substrate assembly manipulations must be performed in the deposition machines. In addition, it is necessary to clean the stencil after multiple uses.

Finally, it is difficult to precisely control the final dimensions of the getter material in the plane of the substrate on which the getter material is deposited since, on the one hand, for a question of mechanical strength, the stencil must have a thickness of several hundred microns, and, on the other hand, there is a significant distance between the stencil and the substrate during deposition of the getter material (generally, at least one hundred microns). The high thickness of the temporary substrate-stencil assembly also presents disadvantages associated with the manipulation of such an assembly, which may be incompatible with some deposition machines.

Imprecisions associated with the alignment between the stencil and the substrate can also be reflected in the positioning of the getter material portions deposited on the substrate.

In all of the cases described above, because the getter material is deposited on one of the two substrates prior to the cycle of assembly of the two substrates, the getter material is therefore exposed to the atmosphere of the chamber in which the seal between the two substrates is produced. The first consequence of this exposure is that it is necessary to bring into line the thermal activation temperature of the getter material and the temperature reached during sealing of the two substrates together so as not to alter the getter material when it is exposed to the gaseous environment of the chamber. Indeed, if the getter material became active before the end of the sealing, it would then begin to pump the surrounding gases before the closure of the cavity. It is therefore not possible to degas the substrates at a temperature above the thermal activation temperature of the getter material. However, to successfully control the final atmosphere in the cavity containing the micro-device, a degassing of the walls defining the cavity is performed.

Alternatively, the micro-device can be encapsulated with a thin film packaging (TFP), which consists of encapsulating the micro-device in a cavity defined by the substrate, on which the micro-device is produced, and a film, or thin film, for encapsulation deposited on the substrate and forming the cap. At least one vent or release hole is produced through the thin encapsulation film so as to remove a sacrificial resin covering the micro-device and on which the thin film forming the cap is deposited, thus releasing the micro-device and creating the cavity. The release hole is then plugged. A getter material can be produced first on the substrate so as to be encapsulated in the cavity with the micro-device.

Such a TFP encapsulation again involves the use of a resin which can degrade the pumping capacities of the getter material. In addition, the getter material is exposed to oxidizing processes enabling the resin to be removed, and which will contribute to the reduction in its pumping capacity.

Patent US 2008/049386 A1 provides a solution that consists not of producing the getter material prior to the production of the cavity, but of plugging the release holes with the getter material. However, in consideration of the limited size (at most several microns in diameter) and the geometry of the release holes, and of the limited height of the cavity (also approximately several microns), it is not possible to produce a large surface of getter material in the cavity. In addition, it is difficult to control the structure of the getter material obtained, and therefore also to control its thermal activation temperature.

This may lead to a thermal activation of the getter material with an excessively high temperature, resulting in degassing of the internal surfaces of the cavity. Finally, with such a process, there is also a risk of pollution of the getter material by the carbon if the sacrificial resin is not completely removed.

DESCRIPTION OF THE INVENTION

Thus there is a need to propose a process for encapsulating a micro-device not using a resin to form the cap and not having the disadvantages of the prior art processes disclosed above.

For this, one embodiment proposes a process for encapsulating a micro-device in a cavity formed between at least one first and one second substrate, comprising at least the steps of:
  producing the micro-device in and/or on the first substrate,
  attaching and securing the second substrate to the first substrate, forming the cavity in which the micro-device is placed,
  producing at least one hole through one of the two substrates, called the drilled substrate, and leading into the cavity opposite a portion of the other of the two substrates, called the receiving substrate,
  depositing at least one getter material portion on said receiving substrate portion through the hole,
  hermetically sealing the cavity by closing the hole.

Thus, the hole(s) may be produced through the first substrate, which comprises the micro-device, or through the second substrate, which forms the cap of the cavity, with one or the other of the two substrates being capable of corresponding to the drilled, or perforated, substrate.

It is also possible to envisage producing holes through the two substrates so as to deposit portions of getter material into the cavity, against the two substrates (taking care, for example, not to produce holes one opposite another). In this case, each substrate (first and second substrates) forms both a receiving substrate intended to receive the getter material and a drilled substrate comprising one or more holes through which the getter material can be deposited.

In this encapsulation process, the getter material is deposited in the cavity after the assembly of the two substrates forming the cavity. Because the cap is formed by a substrate and not by a thin film, the solidity of the cap is improved, making it possible to produce one or more holes of which the shape and sizes are not limited. It therefore becomes possible to deposit portions of getter material with larger dimensions in the cavity.

This encapsulation process provides great freedom of positioning of the getter material in the cavity because there are no constraints on the dimensions, the shape or the positioning of the hole(s) through which or on which the getter material is deposited. By choosing the number, the shape and the dimensions of the holes so that they correspond to the number, the shape and the dimensions of the getter material portions to be produced in the cavity, the getter is deposited directly with the desired dimensions and inside the cavity formed by the two substrates assembled to one another. The substrate forming the cap and/or the substrate comprising the micro-device therefore serves as a stencil through which the getter material is deposited.

The term "substrate" refers to a layer, or a multi-layer, with a thickness generally greater than or equal to around 10 μm, with this thickness distinguishing a substrate from a thin film of which the thickness is only a few microns.

Because the cavity is produced by the attachment and securing of the second substrate, forming the cap, to the first substrate, and not by TFP, the use of a resin to form the cap is avoided, thereby preserving the micro-device from any damage due to the removal of the resin, or malfunctioning due to remaining resin that has been unsuccessfully removed, which may also pollute the getter material.

This encapsulation process makes it possible to avoid the use of a stencil placed temporarily on the substrate which, in addition to the above-described disadvantages associated with this stencil, can also damage the substrate and the micro-device due to the temporary securing. In addition, by comparison with a process using such a stencil, this encapsulation process reduces the number of manipulations of the substrate performed in order to encapsulate the micro-device, and also avoids contamination of the elements associated with the separation of the stencil from the substrate.

This encapsulation process also makes it possible, because the getter material is produced on the receiving substrate after the securing of the second substrate to the first substrate, to avoid exposure of the getter material to the gases present during this securing.

The encapsulation process applies to any type of micro-device, for example, NEMS, MEMS, MOEMS or infrared microsensors such as microbolometers, or any other type of micro-device.

The encapsulation process may be implemented in order to produce a collective encapsulation of a plurality of micro-devices under a controlled atmosphere in different cavities formed by assembling the first substrate to the second substrate.

The deposition of the getter material portion may be produced under forced vacuum, for example in an evaporator, thus enabling the quality of the final atmosphere in the cavity to be improved (the nature of the gases and partial pressures).

The deposition of the getter material portion may be carried out such that the getter material does not obstruct, or choke, the hole. Thus, after the deposition of the getter material and before the hermetic sealing of the cavity obtained by closing the hole, it is possible to access the cavity through the hole which is not obstructed by the getter material.

Advantageously, the dimension of the hole(s) are as large as possible so as to maximize the surface of the getter material deposited with respect to the free surfaces of the substrate receiving the getter material.

The dimensions of the hole, in a plane parallel to one of the main faces of the drilled substrate, may be greater than or equal to around 10 μm, and/or the thickness of the drilled substrate may be greater than or equal to around 50 μm.

The encapsulation process may also comprise the implementation, before the attachment and securing of the second substrate to the first substrate, of a step of structuring said portion of the receiving substrate, forming a relief at said portion of the receiving substrate, wherein the getter material portion is deposited on at least one part of the walls of said relief. The getter material portion may be deposited so that it covers the entirety of the walls of said relief. By depositing the getter material portion on such a relief, the getter material surface exposed in the cavity is increased for the same occupied surface on the receiving substrate. This relief may be hollow or raised. The relief may be such that, for the same space requirement on the receiving substrate, the getter material surface in contact with the atmosphere of the cavity is greater than that obtained for getter material deposited on a planar surface of the receiving substrate.

The relief may form, for example, one or more grooves at said portion of the receiving substrate.

The second substrate may be secured to the first substrate by means of a sealing bead forming lateral walls of the cavity or by a seal produced directly between the second substrate and the first substrate.

The encapsulation process may also comprise, between the step of attaching and securing the second substrate to the first substrate and the step of hermetically sealing the cavity, the implementation of a thinning of the drilled substrate. Such at thinning can make it possible to use, in a first step (during assembly of the two substrate), a thick substrate, with the thinning then enabling a hole or holes to be produced through said substrate. In general, such a thinning may be implemented before the hole(s) is (are) produced through the drilled substrate.

Before the step of attaching and securing the second substrate to the first substrate, the hole can be produced partially through a face of the drilled substrate intended to form a wall of the cavity, i.e. in a part of the thickness of the drilled substrate.

The encapsulation process may also comprise, between the step of producing the hole and the step of depositing the getter material portion, the implementation of a degassing of the walls of the cavity by a thermal treatment of the first and second substrate, and/or the implementation of a deposition of at least one material against the walls of the hole, partially plugging the hole, and/or the implementation of a deposition of at least one material on said portion of the receiving substrate forming a relief on said portion of the receiving substrate, wherein the getter material portion is deposited on at least a part, or portion, of the walls of said relief. Thus, when the surface of the receiving substrate is not structured, the material deposited on the receiving substrate forming the relief can enable a mass of material to be formed prior to the deposition of the getter material.

This mass can then form a relief that makes it possible to then obtain a larger getter material surface exposed in the cavity. This material may also serve as a sub-layer for adjusting the activation temperature of the getter material. In addition, the deposition of material against the walls of the hole, partially plugging the hole, may facilitate the subsequent plugging of the hole.

Because the assembly of the two substrates and the production of the hole(s) through the drilled substrate are performed before the deposition of the getter material through said hole(s), it is possible to degas the walls of the cavity before depositing the getter material portion(s) in the cavity. In this way, the getter material is not contaminated by the gases released during this degassing.

The hermetic sealing of the cavity by closing the hole can be performed by implementing at least one step of deposition, on the drilled substrate, of at least one portion and/or one layer of material covering at least the hole, and/or at least one step of securing a third substrate on the drilled substrate.

The process may also comprise, after the hermetic sealing of the cavity by closing the hole, the implementation of a heat treatment thermally activating the getter material portion.

The process may also comprise, prior to the deposition of the getter material portion, a step of deposition, at least on said portion of the receiving substrate, of at least one adjustment material capable of modifying the thermal activation temperature of the getter material portion, wherein the getter material portion is deposited on said adjustment material.

The dimensions of the hole, at a face of the drilled substrate forming a wall of the cavity, may be smaller than the dimensions of the hole at a face of the drilled substrate opposite that forming a wall of the cavity. In this case, the hole can have a "funnel" shape, facilitating the deposition of the getter material through it.

The step of producing the hole may be implemented before the step of attaching and securing the second substrate to the first substrate.

The deposited getter material portion may not be in contact with the drilled substrate.

The getter material may be non-porous.

BRIEF DESCRIPTION OF THE DRAWINGS

This invention will be easier to understand in view of the examples of embodiments provided purely for indicative and non-limiting purposes, in reference to the appended drawings wherein.

Identical, similar or equivalent parts of the different figures described below have the same numeric references for the sake of clarity between figures.

The different parts shown in the figures are not necessarily shown according to a uniform scale, so as to make the figures more legible.

The different possibilities (alternatives and embodiments) must be understood as being not mutually exclusive and can be combined with one another.

DETAILED DESCRIPTION OF PARTICULAR EMBODIMENTS

Reference is made to FIGS. 1A to 1E, which show the steps of a process for encapsulating a micro-device 100, according to a particular embodiment.

Figure 1A:
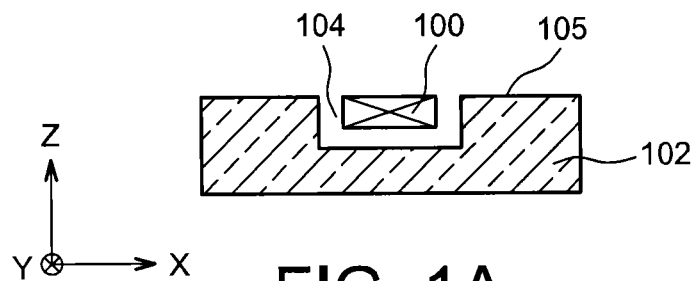
FIGS. 1A to 1H show steps of a process for encapsulating a micro-device, according to a particular embodiment.

The micro-device 100, for example of the MEMS and/or NEMS type, is first produced on and/or in the first substrate 102, for example comprising a semiconductor such as silicon (FIG. 1A).

In this first embodiment, the micro-device 100, which comprises a mobile portion, is at least partially suspended over a space 104 produced in the first substrate 102 at a receiving face 105 intended to be arranged on the side of the cavity in which the micro-device 100 will be encapsulated. The first substrate 102 has, for example, a thickness equal to several hundred microns.

Figure 1B:
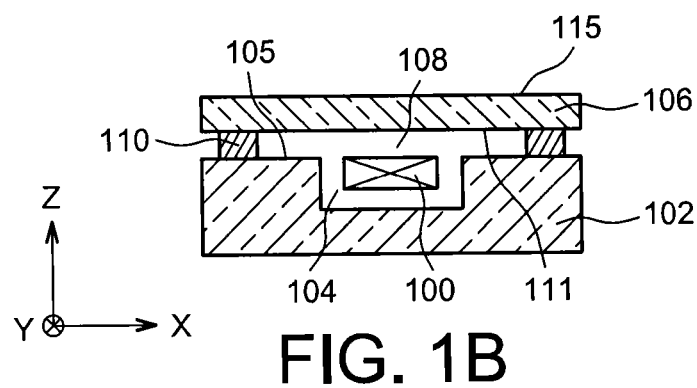

As shown in FIG. 1B, a cap, in this case formed by a second substrate 106 comprising, for example, a semiconductor, such as silicon, or glass, is secured to the first substrate 102, forming a cavity 108 in which the micro-device 100 is placed. The second substrate 106 has, for example, a thickness greater than or equal to around 10 µm, for example between around 10 µm and 1 mm, and preferably greater than around 50 µm.

The second substrate 106 is secured to the first substrate 102 by means of a sealing bead 110 comprising, for example, a fusible material. In an alternative, the sealing bead may comprise at least one getter material, making it possible to thus increase, at the end of the encapsulation process, the getter material surface exposed to the atmosphere of the cavity 108. The cavity 108 is therefore defined by the first substrate 102, the second substrate 106 and the sealing bead 110, which form the internal walls of the cavity 108. The distance between the first substrate 102 and the second substrate 106, in this case corresponding to the thickness of the sealing bead 110, is, for example, between 5 µm and 10 µm, or even greater than 10 µm.

Figure 1C:
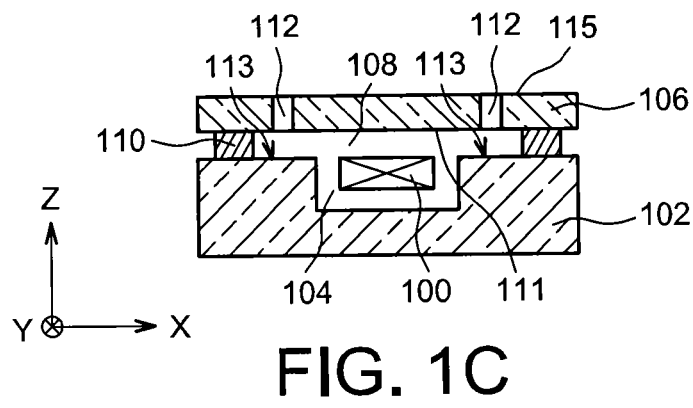
Figure 1D:
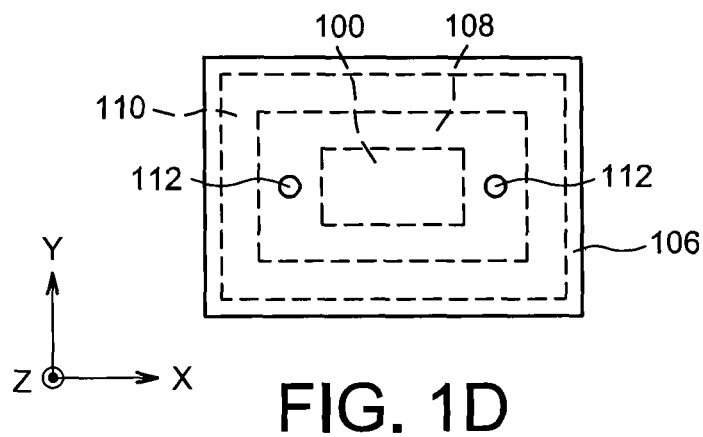
Figure 1E:
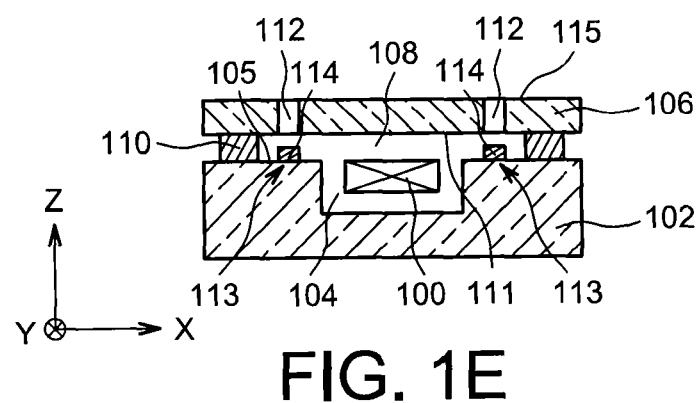

Holes 112, or openings, are then produced through the second substrate 106, passing through the entire thickness of the second substrate 106 and forming an access to the inside of the cavity 108 from the outside (FIGS. 1C and 1D). These holes 112 are intended to form an access to the cavity 108 so as to deposit getter material portions on the first substrate 102. Thus, each hole 112 is produced so that it leads to a portion, or part, 113 of the first substrate 102 (forming part of the face 105) capable of receiving a getter material portion. The first substrate 102 therefore forms a receiving substrate on which the getter material is intended to be deposited, with the second substrate 106 forming a drilled substrate comprising one or more holes through which the getter material is intended to be deposited. In the example described here, the holes 112 open not over the micro-device 100, but next to it. However, if the getter material intended to be deposited in the cavity 108 does not affect the operation of the micro-device 100, it is possible that at least a part of the hole(s) 112 leads to above the micro-device 100. FIG. 1E shows that the holes 112 lead to portions 113 of the first substrate 102 that are peripheral to the space 104 machined in the first substrate 102 and in which the micro-device 100 is located.

In this first embodiment, the holes 112 have a substantially cylindrical shape and have a diameter of between around 2 μm and 100 μm so that the getter material can be deposited through these holes 112. The dimensions of the holes 112 in a plane parallel to one of the main faces 111 and 115 of the second substrate 106, i.e. in a plane parallel to the plane (X, Y), are, for example, greater than around 10 μm, thus making it possible to deposit, on the first substrate 102, getter material portions of dimensions (parallel to the plane (X, Y)) greater than around 10 μm. When the second substrate 106 comprises semiconductor, the holes 112 can be produced by photolithography and anisotropic etching, for example deep reactive ion etching (DRIE). When the second substrate 106 comprises glass, the holes 112 can be produced first by photolithography and sanding on a large portion of the thickness of the substrate, then completed by dry etching (for example, by ion beam etching IBE) through the rest of the thickness of the substrate. The resin deposited on the second substrate 106 to etch the holes 112 is then removed by a dry process.

Prior to the production of the holes 112, the second substrate 106 may be subjected to a thinning step, for example by CMP (chemical mechanical polishing) so that it has a thickness compatible with the production of the holes 112 through it and, for example, between around several dozen micrometers and 1 mm.

In an alternative, prior to the assembly of the second substrate 106 with the first substrate 102, the holes 112 can be partially produced through the second substrate 106, forming holes passing through a portion of the thickness of the second substrate 106, on the side of a face 111 of the second substrate 106 intended to form a wall of the cavity 108. These non-through holes can be produced by photolithography and etching or sanding, depending on the nature of the second substrate 106. The holes 112 are then completed after the assembly of the second substrate 106 to the first substrate 102 either by thinning the second substrate 106, thus opening the holes on the side of a face 115 of the second substrate 106 opposite the face 111, or by performing photolithography and etching steps, or by successively performing these steps so that the holes previously produced in the second substrate 106 are extended through all the thickness of the second substrate 106, and thus form holes 112.

The structure shown in FIGS. 1C and 1D, and in particular the first substrate 102 and the second substrate 106, are then subjected to a heat treatment under vacuum so as to degas the walls of the cavity 108 formed by the first substrate 102 and the second substrate 106. The gases rejected into the cavity 108 are discharged to the outside of the cavity 108 owing to the holes 112.

As shown in FIG. 1E, getter material portions 114 are then deposited on the first substrate 102, around the micro-device 100, at the portions 113 of the first device 102 located opposite the holes 112. The getter material portions 114 produced have a shape and dimensions corresponding substantially to that of the holes 112. In the example of FIG. 1E, the getter material portions 114 therefore have a substantially cylindrical, and even conical shape, of which the diameter at the base corresponds approximately to that of the holes 112. The getter material portions 114 have a thickness (dimension according to the Z axis shown in FIG. 1E), for example, less than around 2 μm. The getter material portions 114 don't obstruct the holes 112 and they are not in contact with the second substrate 106.

The portions 114 can comprise any getter material, i.e. any material having gas absorption and/or adsorption capacities. The portions 114, for example, comprise titanium and/or vanadium and/or zirconium and/or barium and/or chromium. The portions 114 may comprise a non-porous getter material.

Figure 1F:
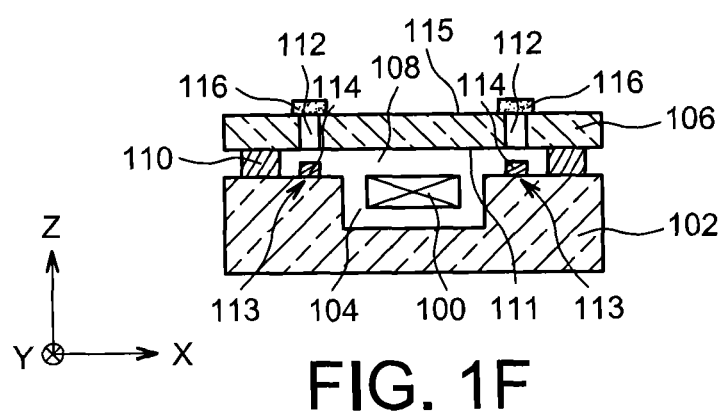

Finally, as shown in FIG. 1F, material portions 116 are produced on the second substrate 106, at the holes 112 so as to close them and thus hermetically encapsulate the micro-device 100 in the cavity 108. A portion of the material forming the portions 116 may be located in the holes 112. The shape and dimensions of these portions 116 are such that they completely close the holes 112 and hermetically seal the cavity 108. The portions 116, for example, comprise a fusible material, for example a tin-based metallic material.

Figure 1G:
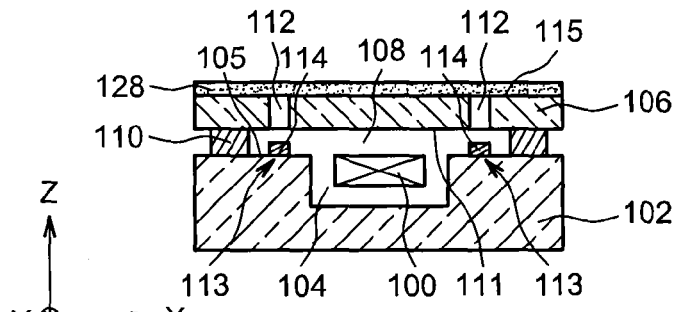

In a first alternative embodiment, the closure of the holes 112 can be performed by a material layer 128, for example comprising at least one metallic material, deposited at least on one portion of the face 111 of the second substrate 106 and so that it closes all of the holes 112 (see FIG. 1G).

Figure 1H:
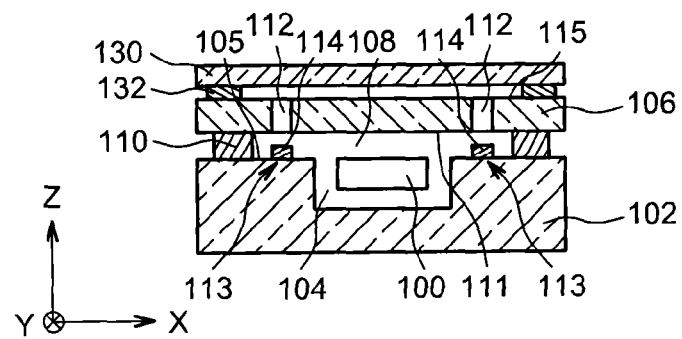

In a second alternative embodiment, the closure of the holes 112 and the hermetic sealing of the cavity 108 can be performed by attaching a third substrate 130 on the face 111 of the second substrate 106 and by sealing this third substrate 130 to the second substrate 106 by means of a fusible material 132 placed between the second substrate 106 and the third substrate 130 (see FIG. 1H). In this case, the getter material can be deposited on the face 115 of the second substrate 106 so that, during the sealing of the third substrate 130 to the second substrate 106, this getter material causes an isothermal solidification of the fusible material 132 placed between the second substrate 106 and the third substrate 130.

The assembly of the third substrate 130 to the second substrate 106 can be performed by a getter/getter assembly as described in the document US 2011/0079889 A1. In this case, after deposition of the getter material 114 through the holes 112, the exterior face 115 of the second substrate 106 is covered with getter material. Then, the third substrate 130 is attached by thermocompression, having been previously covered with a getter material of which the activation temperature may be controlled by an adjustment sub-layer and advantageously below that of the getter deposition 114 inside the cavity 108. This getter/getter assembly may also be envisaged for producing the assembly of the second substrate 106 with the first substrate 102.

The process for encapsulating the micro-device 100 is completed by performing a heat activation of the getter material portions 114, thus triggering the gas absorption and/or the adsorption in the cavity 108 by this getter material.

It is possible to deposit, on the portions 113 of the first substrate 102, prior to the deposition of the getter material portions 114 (through the holes 112 or directly on the first substrate 102 before the assembly of the two substrates 102 and 106), an adjustment material making it possible to modify the thermal activation temperature of the getter material portions 114 that are deposited on this adjustment material. The details of production of such an adjustment material are described in the document EP 2 197 780 B1. Thus, it is possible, for example, to produce the getter material portions 114 and this adjustment material so that the thermal activation temperature of the getter material is less, for example by at least 25° C., than the temperature for degassing the walls of the cavity 108. Another degassing of the walls of the cavity 108 during thermal activation of the getter material, which would pollute the getter material, is thus avoided. The material for adjusting the thermal activation temperature of the getter material can be deposited on the portions 113 of the first substrate 102 prior to the assembly of the second substrate 106 with the first substrate 102, or it can be deposited after this assembly, through the holes 112.

In the example of the encapsulation process described above in reference to FIGS. 1A to 1H, two holes 112 are produced through the second substrate 106. However, it is possible to produce a single hole, or more than two holes, through the second substrate 106. The number of holes, the shape and the dimensions of the holes are adapted according to the number, the shape and the dimensions of the getter material portions to be deposited on the first substrate 102 through these holes, i.e. depending on the getter material surface to be used in the cavity 108.

Figure 2:
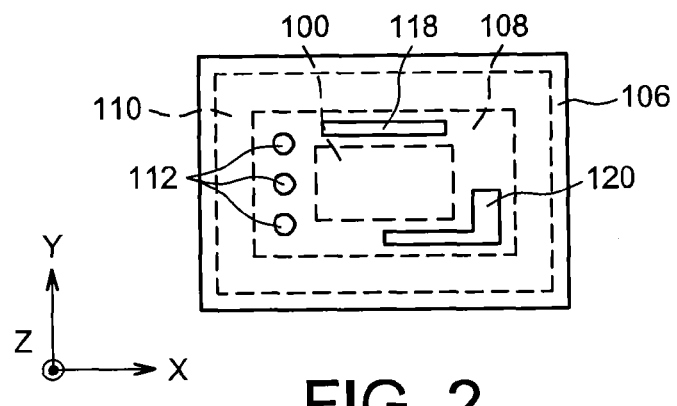
FIGS. 2 to 8 show different alternative embodiments of the process for encapsulating the micro-device.

FIG. 2 shows an example of holes capable of being produced through the second substrate 106. In this example, three holes 112, with shapes and dimensions, for example, similar to the holes 112 shown in FIG. 1D, are produced through the second substrate 106. In addition, a fourth hole 118 is produced through the second substrate 106. This fourth hole 118 has a section, in the plane (X, Y), i.e. in the plane of the face 115 of the second substrate 106, with a substantially rectangular shape. The dimensions of the fourth hole 118 according to the Y axis can be, for example, between 1 μm and 100 μm, and the ratio between the dimension of the hole 118 according to the X axis and the dimension of the hole 118 according to the Y axis is, for example, between around 1 and 100. A fifth hole 120 is produced through the cap 106. This fifth hole 120 has a square shape and corresponds to two holes with a section, in the plane (X, Y), with a substantially rectangular shape, arranged one next to the other, joined and of which the dimensions may correspond to those indicated above for the fourth hole 118.

Figure 3:
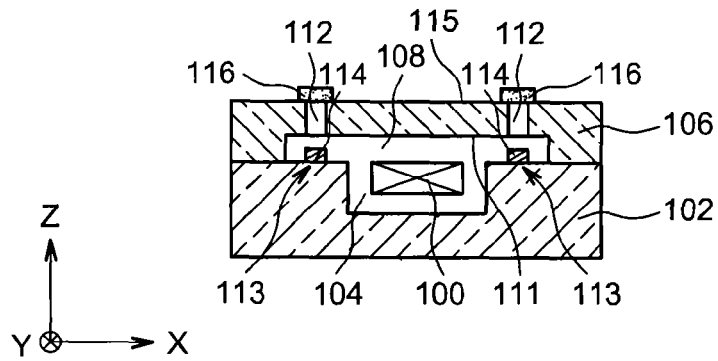

In an alternative of the encapsulation process described above, the second substrate 106 can be assembled directly to the first substrate 102, without using the sealing bead 110. FIG. 3 shows such an encapsulation.

In this example, the second substrate 106 is directly in contact with the first substrate 102. When the second substrate 106 comprises a semiconductor, for example, similar to that of the first substrate 102, the assembly between the second substrate 106 and the first substrate 102 can be produced by a direct silicon/silicon seal, or by thermocompression. When the second substrate 106 comprises glass, the assembly between the second substrate 106 and the first substrate 102 can be produced by an anode seal. It can be seen in the example of FIG. 3 that the second substrate 106 comprises an etched portion, at its face in contact with the first substrate 102, intended to form a portion of the cavity 108 and which avoids having the second substrate 106 be in contact with the micro-device 100. Here again, the getter material portions 114 don't obstruct the holes 112 and they are not in contact with the second substrate 106.

Figure 4:
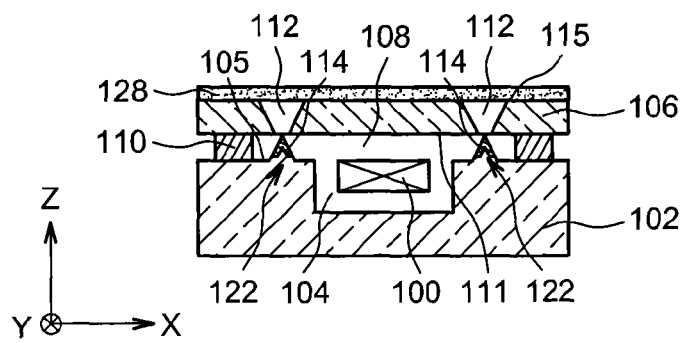

In the examples described above, the getter material portions 114 are deposited on the portions 113 of the first substrate 102 corresponding to planar surfaces. Alternatively, it is possible to structure these portions 113 so as to form reliefs on which the material portions 114 can be deposited. Thus, as shown in FIG. 4, the first substrate 102 can comprise, at the portions 113 of the first substrate 102, embossments 122, or more generally portions forming a relief with respect to the rest of the surface of the first substrate 102, arranged opposite the holes 112. The getter material portions 114 are deposited on the walls of the relief formed by these embossments 122 through the holes 112. This relief is produced so that, for the same space requirement on the face of the first substrate 102 located in the cavity 108, the getter material surface of the portions 114 in contact with the atmosphere of the cavity 108 is greater than that obtained for getter material portions deposited on a planar surface of the first substrate 102 (as in FIG. 1F). This relief formed at the portions 113 of the first substrate 102 intended to receive the getter material portions 114 therefore increases, for the same space requirement of the getter material on the first substrate 102, the gas pumping capacity of the getter material deposited in the cavity 108.

The relief formed by the embossments 122 has a thickness (dimension according to the Z axis shown in FIG. 4, corresponding to the height of the embossments 122 with respect to the rest of the face 105 of the first substrate 102), for example, between around 1 μm and 10 μm and is for example produced, prior to the assembly of the second substrate 106 with the first substrate 102, by steps of photolithography and dry etching (for example RIE) of the face 105 of the first substrate 102 intended to be placed in the cavity 108. The embossments 122 can be produced before, during or after the production of the micro-device 100. Here again, the getter material portions 114 don't obstruct the holes 112 and they are not in contact with the second substrate 106.

In the example of FIG. 4, the holes 112 do not have a cylindrical shape as in the previous examples, but a "funnel" shape. In general, regardless of the shape of the sections of the holes 112 at the faces 111 and 115 of the second substrate 106, the dimensions of the section of the holes 112 at the face 111 of the second substrate 106 forming a wall of the cavity 108 can be smaller than the dimensions of the section of the holes 112 at the face 115 of the second substrate 106 opposite the face 111. Such holes 112 make it possible to facilitate the deposition of the getter material portions 114 through the holes 112. It is possible to produce such holes owing to the fact that the cap of the cavity 108 is formed by a substrate and not by a thin film, which would not have sufficient mechanical strength. The principle of the production of holes with a "funnel" shape can also be applied to the other examples of holes described above and comprising a section with a non-circular shape.

Figure 5:
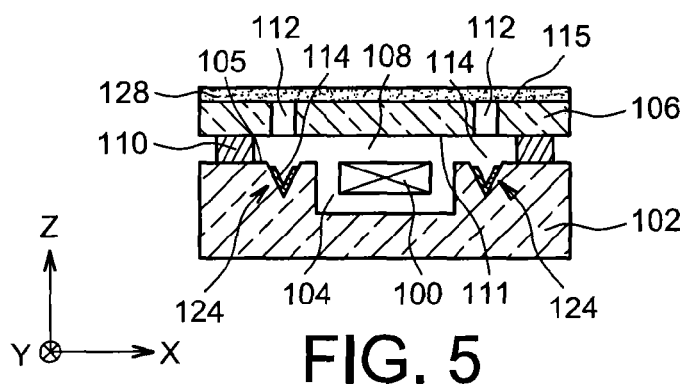

In another alternative shown in FIG. 5, the relief formed at the portions 113 of the first substrate 102 corresponds to recesses 124 produced in the substrate 102, opposite the holes 112.

The getter material portions 114 are deposited on the walls of the recesses 124, through the holes 112. As for the embossments 122, the getter material surface of the portions 114 thus deposited in the cavity 108 is greater than for getter material portions that would be deposited on a planar surface of the first substrate 102, with an equivalent space requirement on the first substrate 102. These recesses 124 can be produced with a depth between around 1 μm and 10 μm, for example by photolithography and dry etching (for example, RIE) of the substrate 102. Here again, the getter material portions 114 don't obstruct the holes 112 and they are not in contact with the second substrate 106.

The embossments 122 and the recesses 124 can be produced in different shapes. In the example of FIG. 4, each of the embossments 122 has a section, in the plane (X, Z), with a substantially triangular shape.

Figure 6A:
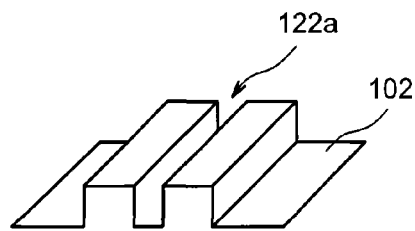

It is also possible to produce, opposite a single hole, a plurality of embossments arranged one next to another, thus forming one or more grooves or slots in which a getter material portion 114 is deposited. For example, as shown in FIG. 6A, two embossments 122a formed one next to the other opposite a single hole, each have a section, in the plane (X,Z), with a substantially rectangular shape.

The space between the embossments 122a forms a groove. The embossments 122 can also be produced with shapes and profiles different from those described here.

Figure 6B:
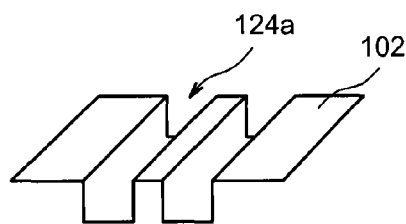

Similarly, the recesses 124 can be produced according to different types of profiles. In the example of FIG. 5, each of the recesses 124 has a section, in the plane (X, Z), with a substantially inverted triangle shape. As for the embossments, it is possible to produce, opposite a single hole, several recesses arranged one next to another, thus forming one or more grooves or slots in which a getter material portion 114 will be deposited. For example, as shown in FIG. 6B, two recesses 124a arranged on next to the other opposite a single hole, each have a section, in the plane (X, Z), with a substantially rectangular shape. In another example shown in FIG. 6C, recesses 124b are produced in the substrate 102. These recesses 124b have a section, in the plane (X, Z), with a substantially trapezoidal shape. Such recesses 124b are, for example, produced by photolithography and wet etching (for example with a KOH solution) of the substrate 102. The recesses 124 can also be produced with shapes and profiles different from those described here.

Figure 6C:
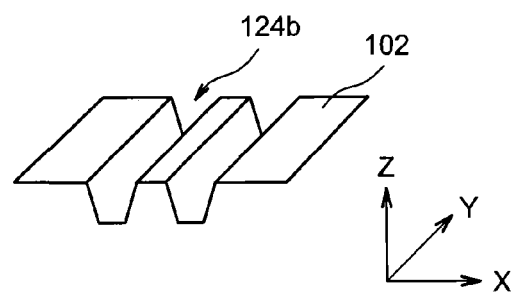

The distance between the second substrate 106 and the first substrate 102 can be between several microns and several dozen microns (and, for example, less than around 100 µm). The dimensions of the relief formed by the recesses or embossments can be such that these dimensions are less than or equal to those of the hole opposite which the relief is located. In the examples of FIGS. 6A to 6C, the dimension according to the X axis of each recess or embossment can be between several microns and around 1 millimeter, with this dimension capable of corresponding substantially to the dimension of the hole according to this same axis.

The dimension according to the Y axis of each recess or embossment can be between several microns and several dozen microns, and, for example, less than around 100 µm. To increase the getter material surface of the getter portion, it is possible to produce as many recesses and/or embossments as possible opposite each hole.

Figure 7:
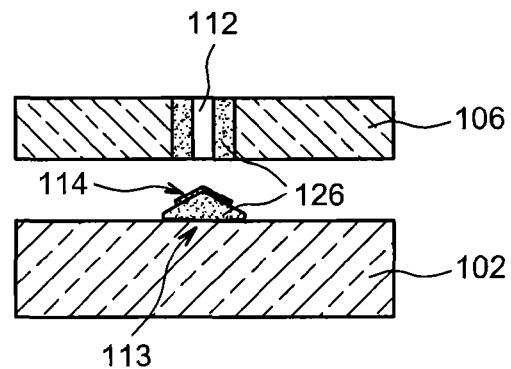

To form a relief capable of having large dimensions on the first substrate 102, it is possible to form one or more holes 112 in the second substrate 106 of which the smallest section corresponds substantially to the section of the base of the relief to be produced. These holes 112 can have any geometry, and advantageously be conical, as shown in FIG. 4. A pre-plugging material 126 is then used to partially close the holes 112, prior to the deposition of the getter material (see FIG. 7). Such a pre-plugging material can be deposited, for example by CVD when this material is silicon oxide or a nitride, on the lateral walls of the holes 112 and also be deposited on the substrate 102, opposite the holes 112, thus forming, at the portions 113 of the first substrate 102, a relief comprising embossments on which the getter material portions 114 can then be deposited, with the getter material then being deposited through the remaining space of the holes 112 not occupied by the pre-plugging material 126. The pre-plugging material 126 deposited against the lateral walls of the holes 112 facilitates the subsequent plugging of the holes which can be performed by a single deposition of material, in particular getter material. The pre-plugging of the holes 112 can be performed so that the holes after this pre-plugging have a diameter equal to several microns.

The getter material portions 114 don't obstruct the holes 112 and they are not in contact with the second substrate 106.

In the examples described above, the holes 112 are produced through the second substrate 106 after having secured the second substrate 106 to the first substrate 102. However, it is also possible to produce these holes 112 through the second substrate 106 prior to the assembly of the two substrates. The holes 112 can, in this case, be produced by anisotropic etching (deep reactive ion etching, DRIE) when the second substrate 106 comprises silicon. If the second substrate 106 comprises glass, the holes 112 can be produced by a sanding-type machining. By producing the holes 112 prior to the assembly of the substrates 102 and 106 to one another, the degassing during the assembly of the internal surfaces defining the cavity 108 is facilitated.

In the embodiments and alternatives described above, the holes 112 are produced through the second substrate 106, which forms the cap. In another embodiment, it is possible for the holes 112 to be produced through the first substrate 102. In this case, the holes are preferably produced prior to the assembly of the second substrate 106 on the first substrate 102.

This embodiment is advantageously produced when the micro-device 100 requires a release step consisting of releasing, for example, a mobile portion of the micro-device 100 with respect to a stationary portion. The link between the two portions is generally ensured by a sacrificial layer, for example comprising silicon oxide. The release step can, in this case, be implemented after the holes have been produced. It is also possible to produce the holes through the first substrate 102 after the second substrate 106 has been secured to the first substrate 102. In every case, it is possible to thin the first substrate 102 prior to the production of the holes through the first substrate 102 by photolithography and DRIE etching. The second substrate 106 then serves as a cap, as well as a mechanical handle.

Figure 8:
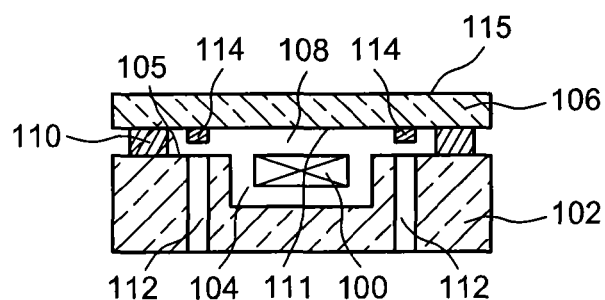

When the holes 112 are produced through the first substrate 102, the second substrate 105 serves as a receiving substrate for the getter material 114, which is deposited on the face 111 of the second substrate 106. The first substrate 102 then forms the drilled substrate through which the getter material is deposited. FIG. 8 shows such a configuration. All of the alternatives and options described above in relation to the configurations in which the first substrate 102 serves as a receiving substrate and the second substrate 106 corresponds to the drilled substrate can be applied to this embodiment in which the first substrate 102 corresponds to the drilled substrate and the second substrate 106 corresponds to the receiving substrate.

The invention claimed is:

1. A process for encapsulating a micro-device, comprising:
producing the micro-device in or on at least one first substrate;
attaching and securing at least one second substrate to the at least one first substrate, forming a cavity therebetween in which the micro-device is disposed;
producing at least one hole through at least one of said at least one first substrate and said at least one second substrate, the at least one hole leading into the cavity opposite a portion of another of said at least one first substrate and said at least one second substrate;

forming a relief by depositing at least one first material on said portion of the another of said at least one first substrate and said at least one second substrate, the relief having at least one sidewall;

depositing at least one second material on said portion of the another of said at least one first substrate and said at least one second substrate through the at least one hole such that the deposited at least one second material does not obstruct the at least one hole, wherein the at least one second material is at least one getter material portion, and is deposited on at least a part of the at least one sidewall on said relief; and hermetically sealing the cavity by closing the at least one hole.

2. The process according to claim 1, wherein a dimension of the at least one hole, in a plane parallel to at least one main face of at least one of said at least one first substrate and said at least one second substrate, is greater than or equal to around 10 μm, or has a thickness greater than or equal to around 50 μm.

3. The process according to claim 1, wherein the forming of said relief includes structuring said portion of the another of said at least one first substrate and said at least one second substrate followed by said depositing of the at least one first material on said portion that is structured, before said attaching and securing of said at least one second substrate to said at least one first substrate.

4. The process according to claim 3, wherein the relief forms one or more grooves at said portion of the another of said at least one first substrate and said at least one second substrate.

5. The process according to claim 1, wherein the at least one second substrate is secured to the at least one first substrate by a sealing bead forming lateral walls of the cavity, or by a seal produced directly between the at least one second substrate and the at least one first substrate.

6. The process according to claim 1, further comprising thinning of said at least one of said at least one first substrate and said at least one second substrate, said thinning occurring between said attaching and securing of said at least one second substrate to said at least one first substrate and said hermetically sealing the cavity.

7. The process according to claim 1, wherein the at least one hole is produced partially through a main face of said at least one of said at least one first substrate and said at least one second substrate to form at least one wall of the cavity, before said attaching and securing of said at least one second substrate to said at least one first substrate.

8. The process according to claim 1, further comprising degassing of at least one wall of the cavity by a thermal treatment of said at least one first substrate and said at least one second substrate, or depositing said at least one first material against at least one wall of said at least one hole, thereby partially plugging said at least one hole, said degassing or said depositing occurring between said producing the at least one hole and said depositing the at least one second material on said portion of the another of said at least one first substrate and said at least one second substrate through the at least one hole.

9. The process according to claim 1, wherein the hermetically sealing the cavity by closing the at least one hole is performed by covering the at least one hole by depositing at least one third material on at least a part of the at least one of said at least one first substrate and said at least one second substrate, or by securing a third substrate to the at least one of said at least one first substrate and said at least one second substrate.

10. The process according to claim 1, further comprising performing a heat treatment to thermally activate the at least one getter material portion, after the hermetically sealing the cavity by closing the at least one hole.

11. The process according to claim 1, further comprising, prior to the depositing of the at least one getter material portion, depositing at least one adjustment material for modifying a thermal activation temperature of the at least one getter material portion, wherein the at least one getter material portion is deposited on said adjustment material.

12. The process according to claim 1, wherein a first dimension of the at least one hole, at a first face of the at least one of said at least one first substrate and said at least one second substrate that forms at least one wall of the cavity, is smaller than a second dimension of the at least one hole, at a second face of the at least one of said at least one first substrate and said at least one second substrate that is opposite to the first face that forms said at least one wall of the cavity.

13. The process according to claim 1, wherein the producing the at least one hole occurs before said attaching and securing of said at least one second substrate to said at least one first substrate.

14. The process according to claim 1, wherein the deposited second material is not in contact with the at least one of said at least one first substrate and said at least one second substrate.

15. A process for encapsulating a micro-device, comprising:

producing the micro-device in or on at least one first substrate;

attaching and securing at least one second substrate to the at least one first substrate, forming a cavity therebetween in which the micro-device is disposed;

producing at least one hole through at least one of said at least one first substrate and said at least one second substrate, the at least one hole leading into the cavity opposite a portion of another of said at least one first substrate and said at least one second substrate;

forming a relief by depositing at least one first material on said portion of the another of said at least one first substrate and said at least one second substrate, the relief having at least one sidewall, wherein the at least one first material is also deposited on at least one wall of the at least one hole, thereby partially closing the at least one hole;

depositing at least one second material on said portion of the another of said at least one first substrate and said at least one second substrate through the at least one hole such that the deposited at least one second material does not obstruct the at least one hole, wherein the at least one second material is at least one getter material portion, and is deposited on at least a part of the at least one sidewall on said relief; and hermetically sealing the cavity by closing the at least one hole.

16. A process for encapsulating a micro-device, comprising:

producing the micro-device in or on at least one first substrate;

attaching and securing at least one second substrate to the at least one first substrate, forming a cavity therebetween in which the micro-device is disposed;

producing at least one hole through at least one of said at least one first substrate and said at least one second substrate, the at least one hole leading into the cavity opposite a portion of another of said at least one first substrate and said at least one second substrate;

forming a relief by depositing at least one first material on said portion of the another of said at least one first substrate and said at least one second substrate,
- wherein the relief has at least one sidewall and at least one embossment having a section with a substantially triangular shape in a plane that is perpendicular to at least one main face of said portion of the another of said at least one first substrate and said at least one second substrate;

depositing at least one second material on said portion of the another of said at least one first substrate and said at least one second substrate through the at least one hole such that the deposited at least one second material does not obstruct the at least one hole,
- wherein the at least one second material is at least one getter material portion, and is deposited on at least a part of the at least one sidewall on said relief; and hermetically sealing the cavity by closing the at least one hole.

\* \* \* \* \*